United States Patent
Travostino et al.

(10) Patent No.: US 6,294,910 B1
(45) Date of Patent: Sep. 25, 2001

(54) DIGITAL POSITION SENSOR FOR SENSING POSITION OF A MOVING TARGET

(75) Inventors: Francis Travostino, Annecy le Vieux; Alain Bochet, Seynod, both of (FR)

(73) Assignee: The Torrington Company, Torrington, CT (US)

( * ) Notice: Subject to any disclaimer, the term of this patent is extended or adjusted under 35 U.S.C. 154(b) by 0 days.

(21) Appl. No.: 09/161,085

(22) Filed: Sep. 25, 1998

(30) Foreign Application Priority Data

Sep. 26, 1997 (FR) .................................................. 97 12033

(51) Int. Cl.[7] .............................. H03M 1/22; G01B 7/30; G05B 11/32; G01D 5/244; H03K 12/00
(52) U.S. Cl. ...................... 324/207.25; 318/601; 341/15; 341/116
(58) Field of Search ........... 324/207.12, 207.15–207.25; 250/231.16; 341/13, 15, 113, 116, 117; 318/594, 600, 601, 604, 605, 661

(56) References Cited

U.S. PATENT DOCUMENTS

| | | | |
|---|---|---|---|
| 3,594,783 | * 7/1971 | Bullock | 341/117 |
| 4,262,526 | 4/1981 | Makita et al. | |
| 4,390,865 | * 6/1983 | Lauro | 341/116 |
| 4,707,695 | 11/1987 | Takahashi et al. | |
| 4,998,105 | * 3/1991 | Takekoshi et al. | 324/207.25 X |
| 5,029,304 | * 7/1991 | Tolmie, Jr. | 341/15 |
| 5,173,693 | * 12/1992 | Fry | 341/15 |
| 5,451,945 | * 9/1995 | Alhorn et al. | 341/117 X |

FOREIGN PATENT DOCUMENTS 0 469 318 B1   3/1991   (DE) .

* cited by examiner

*Primary Examiner*—Gerard R. Strecker
(74) *Attorney, Agent, or Firm*—John C. Bigler

(57) ABSTRACT

A moving target opposite a stationary analog sensor has two sensitive elements delivering two sinusoidal output signals, of equal maximum amplitudes, centered on the same average value, in quadrature and with a period equal to one revolution of the target. A device for processing the two output signals, generates n output signals in-parallel, where n is a positive whole number greater than or equal to 2, for providing the position of a rotating component, connected to the moving target, with a resolution equal to $2^n$. The processing device includes a generator device, a detection device, a multiplexing device and an interpolation device.

23 Claims, 13 Drawing Sheets

DIGITAL POSITION SENSOR FOR SENSING POSITION OF A MOVING TARGET

BACKGROUND OF THE INVENTION

This invention relates generally to a digital position sensor, and, more particularly to one of absolute position, and which is suitable for use in sensor bearings for automobile or industrial applications. A digital sensor of this type can be mounted in the bearings of an automobile steering column in order to check the path of the vehicle, or in systems for checking or controlling the position of a robot or of a machine tool, for example.

An absolute position sensor indicates very precisely the position of the moving components, so that they can be controlled and, above all, so that these components can be relocated when the system in which they are integrated is activated. Such sensors have the advantage of avoiding preliminary initialization before functioning, by detecting a reference pulse as in the case of a relative position sensor. An absolute position sensor delivers a number of output signals in the case of a parallel digital output signal, but in the case of a series digital output signal, the sensor delivers a single signal resulting from a shaping according to a data transmission protocol and executed from the signals in parallel described in therein.

Although the code provided by the output signals for marking the absolute position can be any code, a binary code or the Gray code is nevertheless preferably used. FIG. 1 is an example of parallel output signals encoded in the Gray code and delivering 512 points, in other words 512 different positions per revolution. Moreover, in the case of a sensor delivering a positive whole number n of output signals in parallel, there are generally n different tracks supported by the encoder, each having a specific coding and n stationary sensors intended for reading the information provided by these n tracks. In other words, the number of sensors and of coded tracks is equal to the number of available output signals allowing one to obtain a maximum resolution equal to $2^n$.

This type of device can be produced with an optical encoder, using a disk engraving technology allowing one to produce very fine lines. The advantage of such an optical encoder is that it delivers digital signals which are much more reliable than the signals coming from analog absolute position sensors of the potentiometric type, particularly when the ambient temperature varies. However, the use of such a device is limited to applications executed in ambient conditions which are not very severe, with a low level of pollution and vibrations, and at an ambient temperature less than 100 degrees C.

In order to reduce these limitations, there are magnetic encoders consisting of a multitrack and multipolar magnetic disk connected to the moving part of the device and several magnetic sensors connected to the stationary part of the device. On the moving disk, a number of magnetic pole pairs provide a sequence of equally distributed north and south poles, which successively pass before sensors of the type of Hall effect probes, magnetoresistive probes or of the inductive type. These magnetic position sensors can be advantageously integrated in bearings, as described in the French Patent Applications published under Nos. FR 2 678 329 and FR 2 660 028 in the name of the applicant.

In contrast, the main disadvantage of such magnetic encoders is the encumbrance of their large spatial requirements when several magnetic tracks are arranged on the disk, for the purpose of obtaining a coding and output signals identical to those obtained with an absolute position optical encoder. In effect, a minimum spacing must be kept between each of them in order to reduce their mutual influence, which is detrimental to the precision of the output signals representing the absolute position of the system in which the sensor is placed. Moreover, the traditional multipolar magnetization, obtained from a coiled magnetizer through which strong electric currents flow, is very complicated.

There are magnetic devices, however, which allow one to solve these problems of spatial requirements, on one hand, and of magnetization, on the other hand, consisting of a magnetic disk made of a thin layer material in which the technology of the magnetic writing allows for the writing of an extremely high density of information, and of inductive or magnetoresistive sensors suitable for reading the coded information written on the disk. Their disadvantages are of two types: they require a very small reading air gap, which is incompatible with conditions of industrial applications, and they are relatively fragile in use.

The foregoing illustrates limitations known to exist in present devices and methods. Thus, it is apparent that it would be advantageous to provide an alternative directed to overcoming one or more of the limitations set forth above. Accordingly, a suitable alternative is provided including features more fully disclosed hereinafter.

SUMMARY OF THE INVENTION

In one aspect of the invention, this is accomplished by providing a digital position sensor comprising, on the one hand, a moving target opposite a stationary analog sensor comprised of two sensitive elements delivering two sinusoidal output signals, of equal maximum amplitudes, centered on the same average value, in quadrature and with a period equal to one revolution of the target, and on the other hand, a device for processing the two output signals, generating n output signals in parallel, where n is a positive whole number greater than or equal to 2, for providing the position of a rotating component, connected to the moving target, with a resolution equal to $2^n$. The processing device includes generation means, detection means, multiplexing means and interpolation means. The generation means generates, from the two input signals, $2^{m-1}$ signals of the same amplitude, centered on the same average value and successively phase shifted by $2\pi/2^{m-1}$ with respect to one another, where m is a positive whole number less than or equal to n. The detection means detects $2^m$ sectors delimited by the $2^{m-1}$ signals, providing m digital signals which correspond to the high order bits of the signal and which are encoded in such a way as to define the $2^m$ identical sectors. The multiplexing means provides analog multiplexing of the $2^{m-1}$ signals delivered by the generating means, controlled by the m digital signals coming from the detection means, and delivering two signals, one of which is made up of the sequence of the portions of the $2^{m-1}$ signals whose amplitude is between the centering value and a first threshold, and the other of which is made up of the sequence of the portions of the $2^{m-1}$ signals whose amplitude is between the first threshold and a second threshold higher than the first. The interpolation means provides fine interpolation of the two signals coming from the multiplexing means, in each of the $2^m$ sectors, in order to generate (n-m) digital signals which correspond to the low order bits of the signal and which are encoded in such a way as to cut each of the $2^m$ sectors into $2^{n-m}$ identical subsectors with angle $2\pi/2^n$ in order to obtain the desired resolution, all of the digital output signals $(b_1, \ldots, b_{n-m}, b_{n-m+1}, \ldots, b_n)$ of the position sensor being representative of the absolute position of the rotating component.

The foregoing and other aspect will become apparent from the 20 following detailed description of the invention when considered in conjunction with the accompanying drawing figures.

BRIEF DESCRIPTION OF THE DRAWING FIGURES

DETAILED DESCRIPTION

The digital position sensor, to which the invention relates, consists of a moving target, connected with the rotating component whose position one wishes to know, and of a stationary analog sensor. This sensor is composed of two sensitive elements, delivering two sinusoidal output signals $S_1$ and $S_2$, of the same amplitude $A_0$, centered on the same average value $C_0$ and in quadrature. Moreover, they have a period T equal to one revolution of the target, or $2\pi$ radians.

Figure 2:
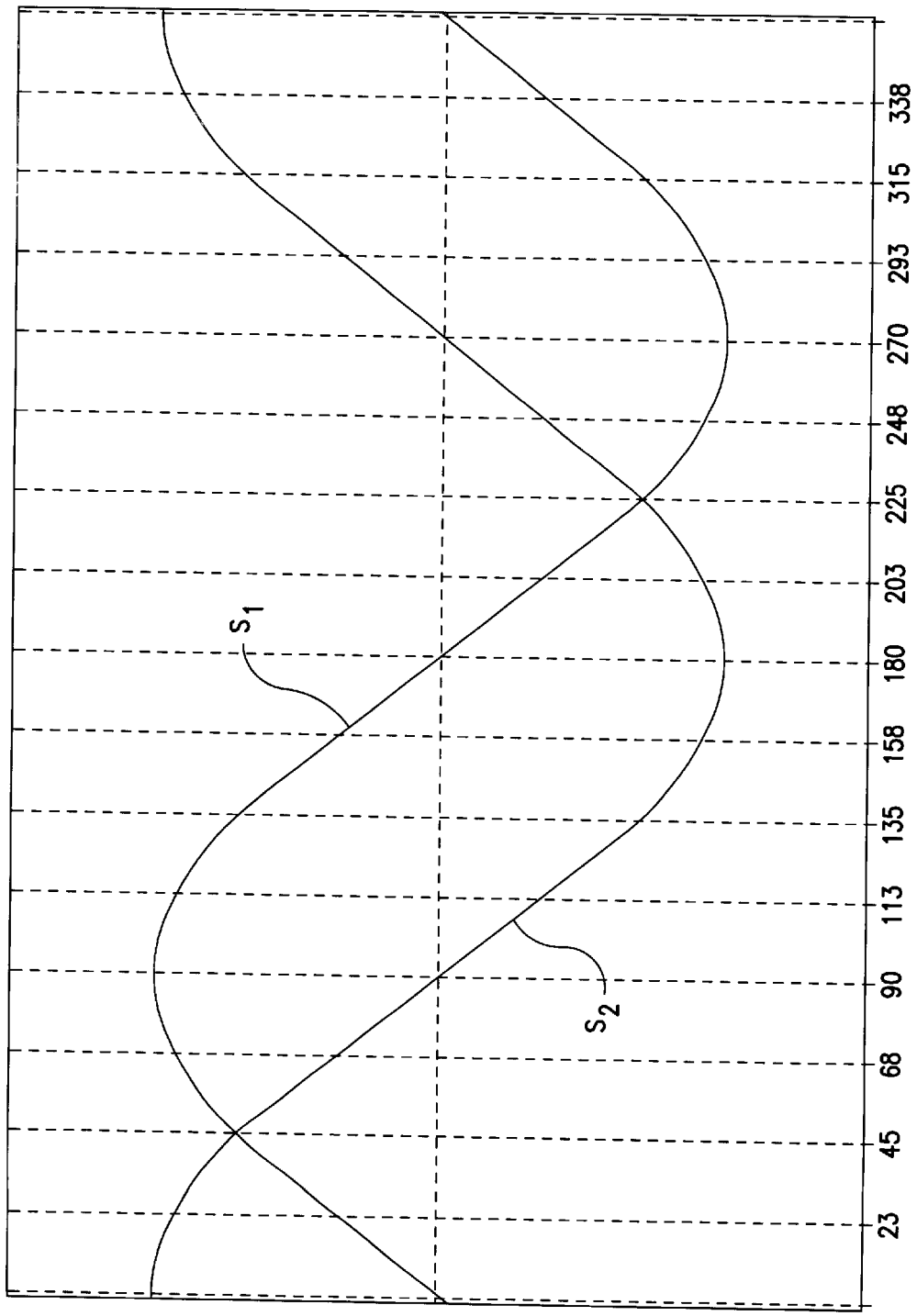
FIG. 2 is a graphic representation of the input signals of the digital sensor according to the invention.

FIG. 2 is a graphic representation of these two signals $S_1$ and $S_2$ output from the magnetic sensor.

The main characteristic of the digital sensor according to the invention is that it also has a processing device which has some means for processing these two signals $S_1$ and $S_2$ delivered by the two stationary sensitive elements, allowing one to obtain a high resolution per revolution. In a first part of the description, the processing of the signals $S_1$ and $S_2$ allows one to generate n digital output signals determining the absolute position through one complete revolution of the moving part of the rotating component, and in a second part, the processing of the signals allows one to give the relative position of this component, thanks to three signals obtained from the preceding n signals.

Figure 1:
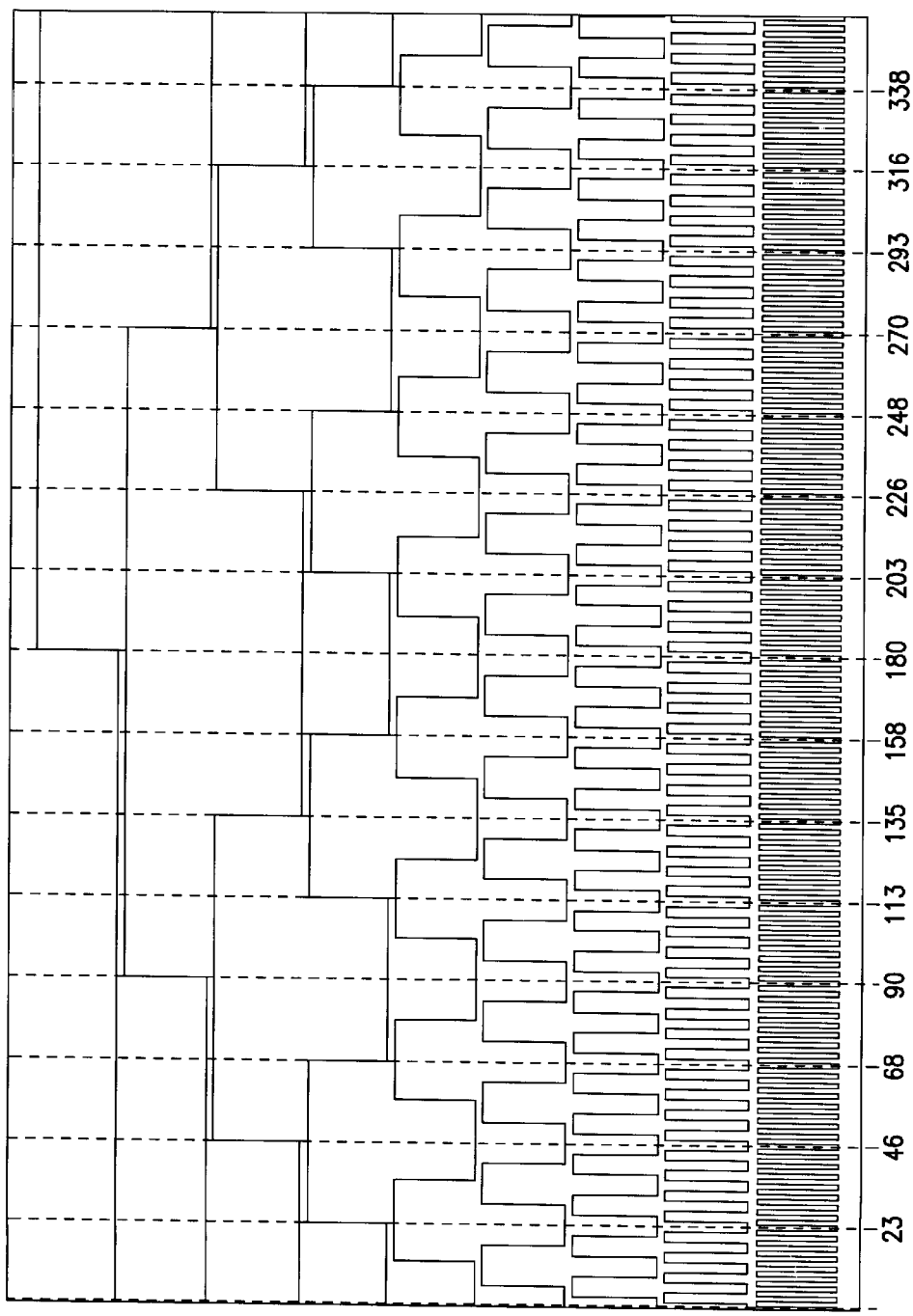
FIG. 1 is an example of the output signals of a prior art digital absolute position sensor, encoded in the Gray code.

In the following description of a particular embodiment example, the position sensor allows one to obtain a resolution of $2^9$ or 512 points per revolution, by generating nine digital output signals $b_1$ to $b_9$, such as those represented in the Gray code in FIG. 1. This numerical example is non-limiting, and the process for treating the signals coming from the sensitive elements of the sensor allows one to obtain any resolution value, regardless of whether or not it is a power of 2, and according to any binary code. The advantage of the aforementioned Gray code is that it only has one change of state on the nine output signals $b_1$ to $b_9$ during the passage of the target from position x to position x+1.

Figure 3:
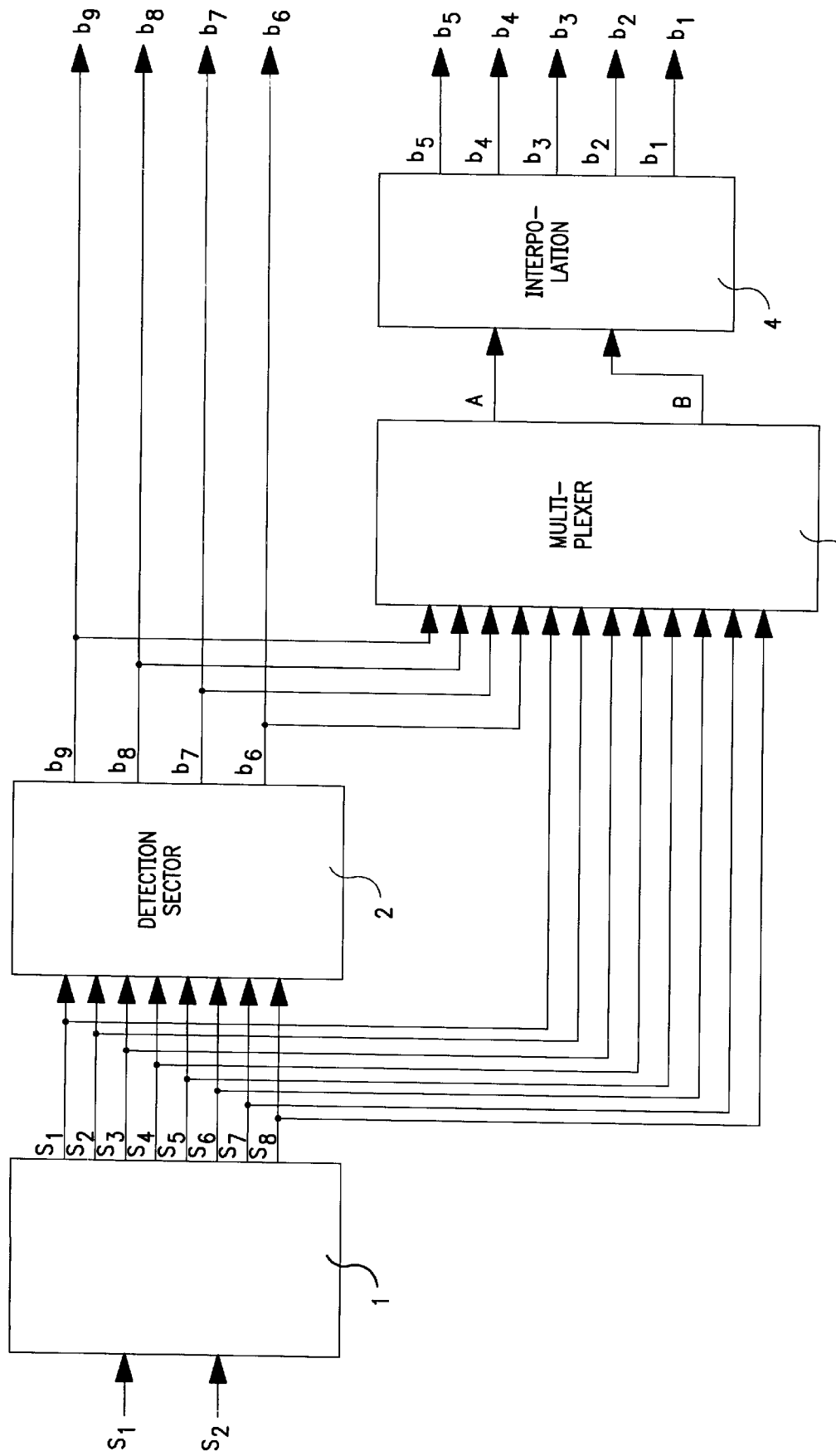
FIG. 3 is a functional electronic schematic diagram of a digital absolute position sensor according to the invention.

The means for electronic processing of the signals $S_1$ and $S_2$ coming from the absolute position sensor are essentially four in number, of which the functional electronic schematic diagram is the object of FIG. 3. In order to obtain a resolution equal to $2^n$, n being a positive whole number greater than or equal to 2, it is first composed of means 1 for generating a number equal to $2^{m-1}$ sinusoidal signals $S_i$ from the two signals $S_1$ and $S_2$, where m is a positive whole number less than or equal to n, and i is a positive whole number varying from 1 to $2^{m-1}$.

The $2^{m-1}$ signals $S_i$ make it possible to delimit $2^m$ identical in sectors $P_i$, in the $2\pi$ radians of one revolution of the target, of size equal to $2\pi/2^m$ radians each. These signals $S_i$ are sinusoidal, of the same amplitude $A_0$, and successively phase-shifted by $2\pi/2^{m-1}$ with respect to one another. They are obtained by simple linear combinations of $S_1$ and $S_2$ using only weighted sums or differences, whose combinations vary according to the values of m.

Figure 4A:
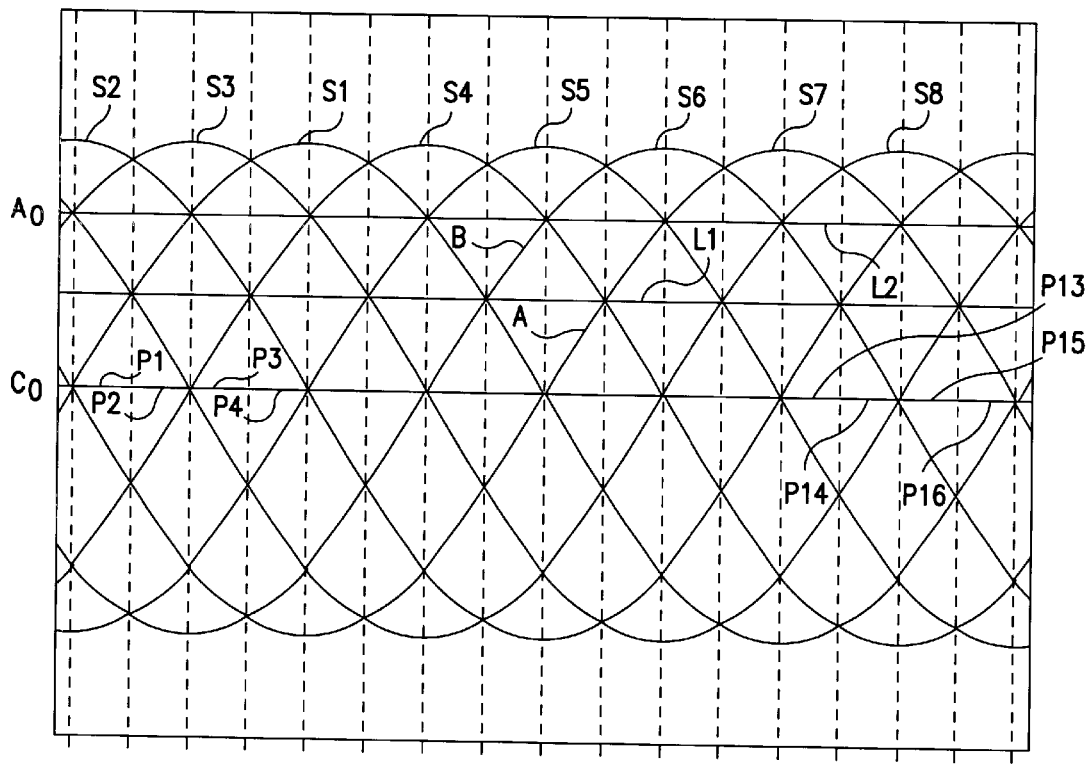
FIGS. 4a and 12a are graphic representations of different signals delivered by means constituting the sensor according to the invention.
Figure 5:
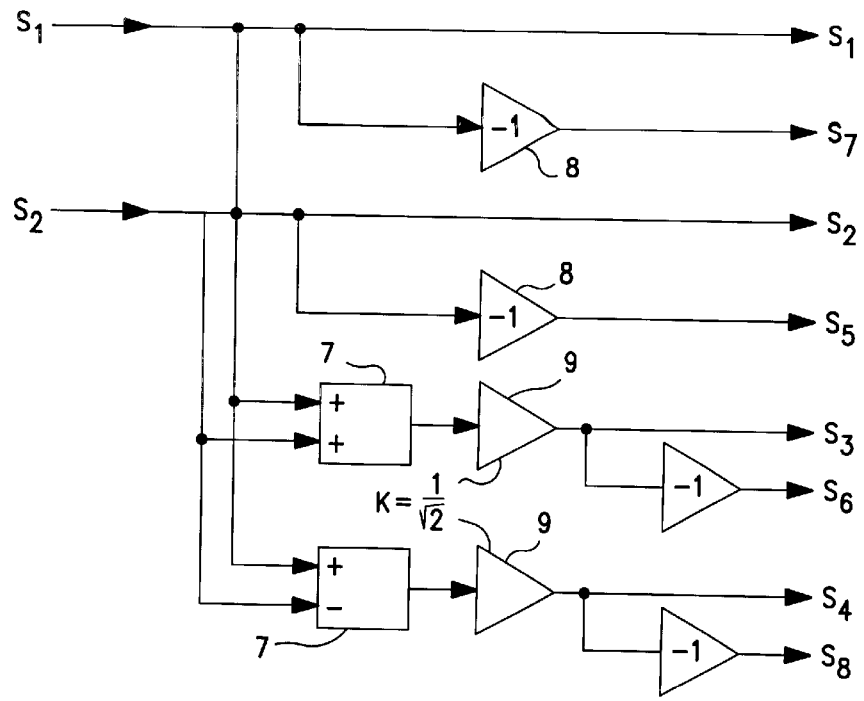
FIGS. 5, 6, 7a to 7d, 8, 9, 10 and 11 are flow charts of embodiment examples of the different means constituting the processing device of the position sensor, according to the invention.

FIG. 4a is a graphic representation of the signals $S_i$ generated from the two signals $S_1$ and $S_2$, numbering $2^{m-1}=8$, where m is equal to 4 in the embodiment example selected. These eight signals $S_1$ to $S_8$ can be used for the definition of sixteen sectors $P_1$ to $P_{16}$, and are phase shifted by $2\pi/8$ or 45 degrees in this example. FIG. 5 is an electronic schematic diagram of a nonlimiting example of means 1 for generation of the eight signals $S_i$, including summing circuits 7, NOT circuits 8 and amplifiers 9 for the determined factors K. In the chosen example, the signals have the values:

$$S_7 = -S_1$$

$$S_5 = -S_2$$

$$S_3 = \frac{S_1 + S_2}{K} = \frac{S_1 + S_2}{\sqrt{2}}$$

$$S_6 = -S_3$$

$$S_4 = \frac{S_1 - S_2}{\sqrt{2}}$$

$$S_8 = -S_4$$

The position sensor then has means 2 for detection of the $2^m$ sectors $P_i$ delimited by the $2^{m-1}$ signals $S_i$, delivering m digital signals $b_{n-m+1}$, $b_{n-m+2}$, ..., $b_{n-1}$, $b_n$ which correspond to the high order bits of the signal. The m digital signals are encoded by a determined binary code for which each combination only arrives once per revolution, in order to define unambiguously the $2^m$ sectors $P_i$, and are obtained by comparisons of the $2^{m-1}$ signals $S_i$ between them, followed by logical combinations between the digital signals issuing from these comparisons. These operations use comparators 10 and logic gates 11, of the AND and OR type.

Figure 6:
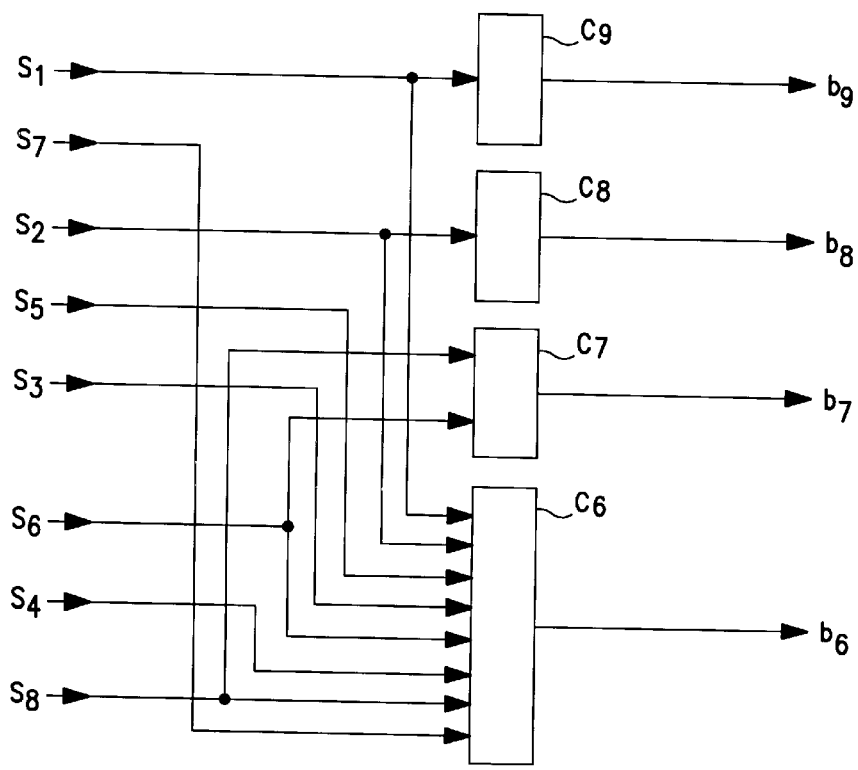
Figure 7A:
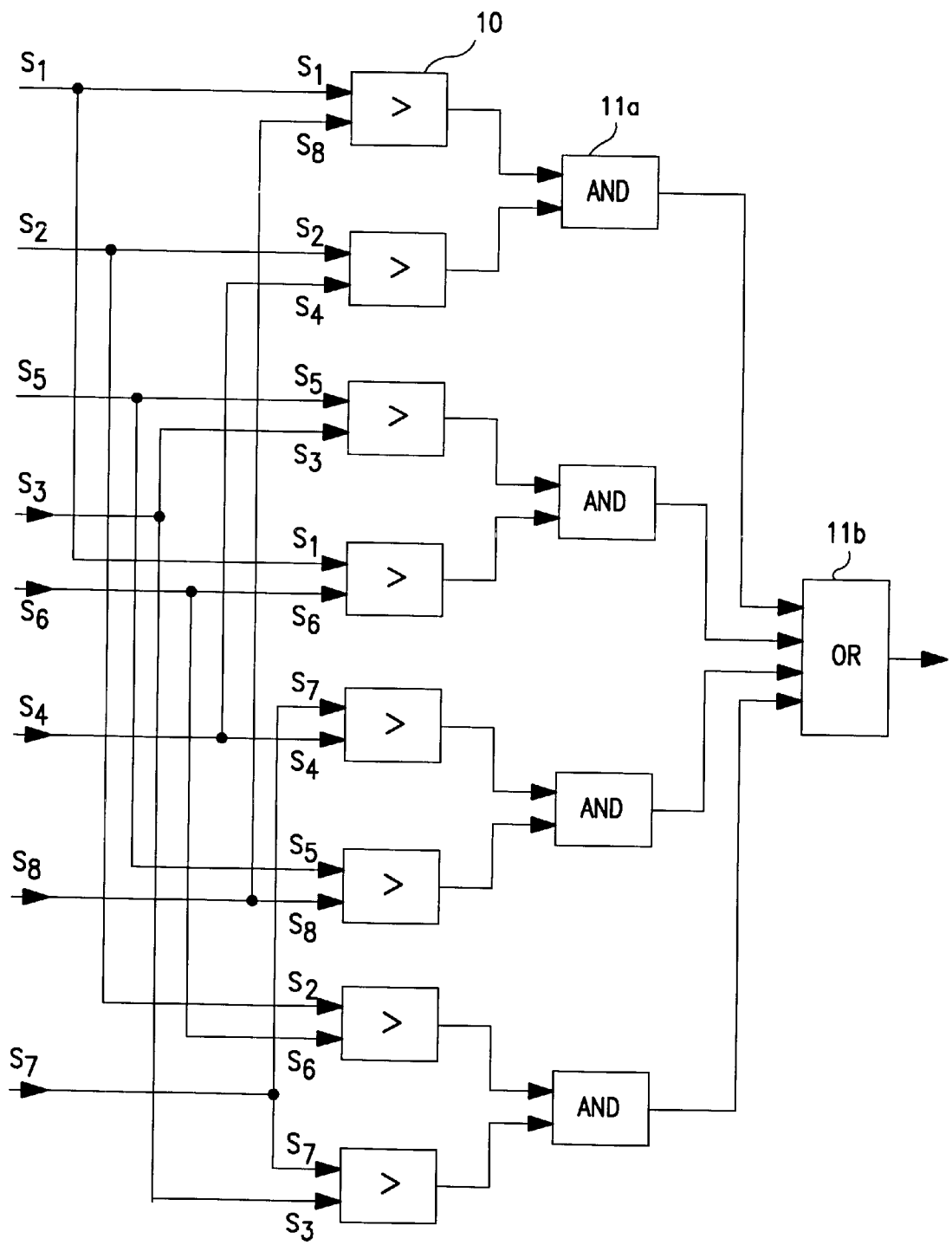

FIG. 6 is an electronic schematic diagram of a nonlimiting embodiment example of means 2 for detection of the sixteen sectors, of the chosen numerical example, essentially including four combinations $C_6$ to $C_9$ of comparators 10 and of logic gates 11a, and 11b respectively delivering the digital signals $b_6$ to $b_9$. Each of these combinations $C_6$ to $C_9$ is represented in FIGS. 7a to 7d respectively. Thus, as shown by FIG. 7a, the combination of circuits $C_6$ delivers the digital signal referenced $b_6$, which is equal to 1 if the signals $S_i$ meet the following conditions:

$b_6$=1 if $(S_1>S_8$ and $S_2>S_4)$ or $(S_5>S_3$ and $S_1>S_6)$ or $(S_7>S_4$ and $S_5>S_8)$ or $(S_2>S_6$ and $S_7>S_3)$.

Figure 7B:
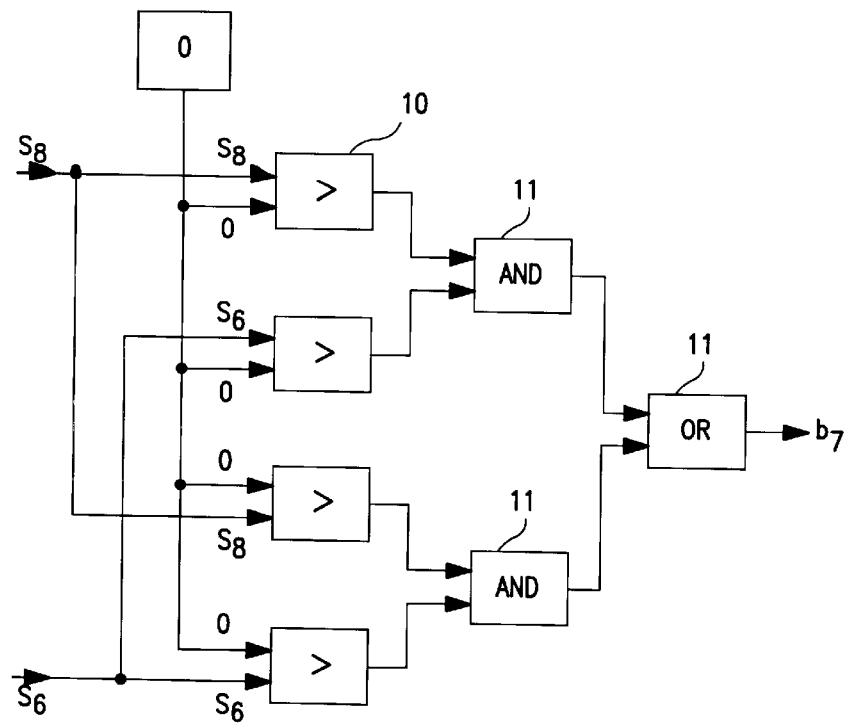

According to the combination $C_7$ of FIG. 7b, the digital signal $b_7$ is such that:

$b_7$=1 if ($S_3$>0 and $S_4$>0) or ($S_6$>0 and $S_8$>0)

Figure 7C:
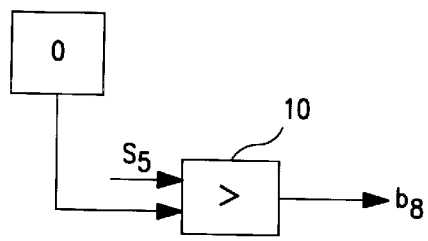

According to the combination $C_8$, represented in FIG. 7c, the binary signal be is such that:

$b_8$=1 if $S_5$>0.

Figure 7D:
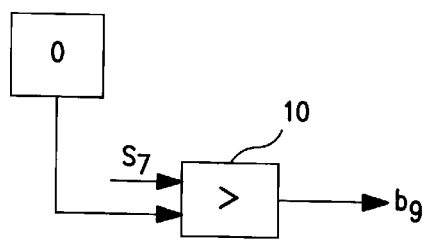

And in FIG. 7d, the combination $C_9$ shows that the binary signal bg is such that:

$b_9$=1 if $S_7$>0.

Figure 4B:
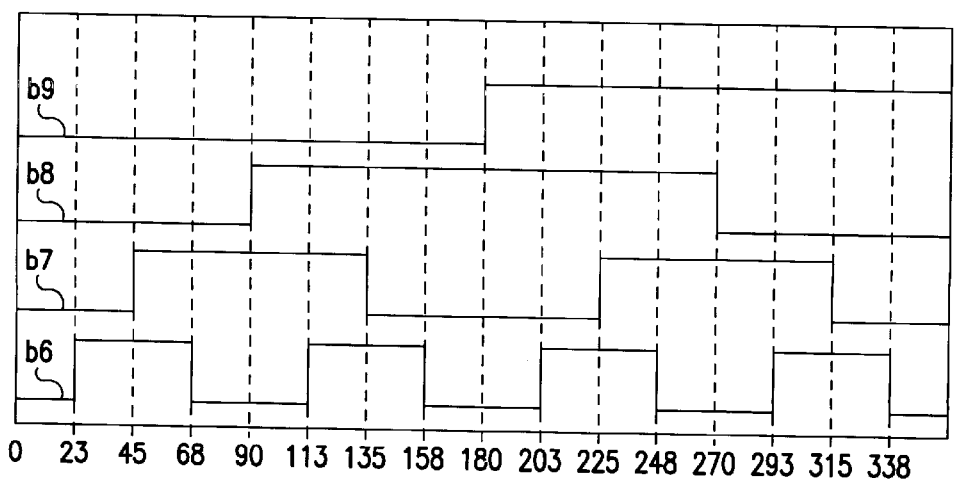
FIGS. 4b and 12b are all of the output signals of an absolute position sensor according to the invention.

FIG. 4b is a graphic representation of the four digital signals, $b_6$, $b_7$, $b_8$ and $b_9$, obtained at the output of means 2 for detection of the sectors, which are encoded in Gray code.

The electronic processing of the signals $S_1$ and $S_2$ is continued with a step of generating two signals A and B, which are used in the next step of fine interpolation. For this, the position sensor has means 3 for analog multiplexing of the $2^{m-1}$ signals $S_i$, which are delivered by the preceding means 1, with, as control signals, the m digital signals $b_{n-m+1}$, $b_{n-m+2}$, ... $b_{n-1}$, $b_n$ delivered by the preceding means 2, and delivering two output signals A and B. One of the signals, A, is a DC electrical signal and is formed by the sequence of the portions of the $2^{m-1}$ signals $S_i$ whose amplitude is between the centering value C and a first threshold $L_1$, whose value is chosen to be equal to $A_0$ sin $(2\pi/2^m)$. The second signal, B, is also a DC electrical signal and is formed by the sequence of the portions of the $2^{m-1}$ signals $S_i$ whose amplitude is between the first threshold $L_1$ and a second threshold $L_2$ of value greater than $L_1$, and chosen to be equal to $A_0$ $\sin(2\pi/2^{m-1})$.

FIG. 4a shows these two signals A and B, in the particular embodiment example in which $L_1$=$A_0$ sin 22.5 and $L_2$=$A_0$ sin 45, in the case in which the input signals of the multiplexer are the signals $S_1$ to $S_8$ and the control signals are the four digital signals $b_6$ to $b_9$.

Figure 8:
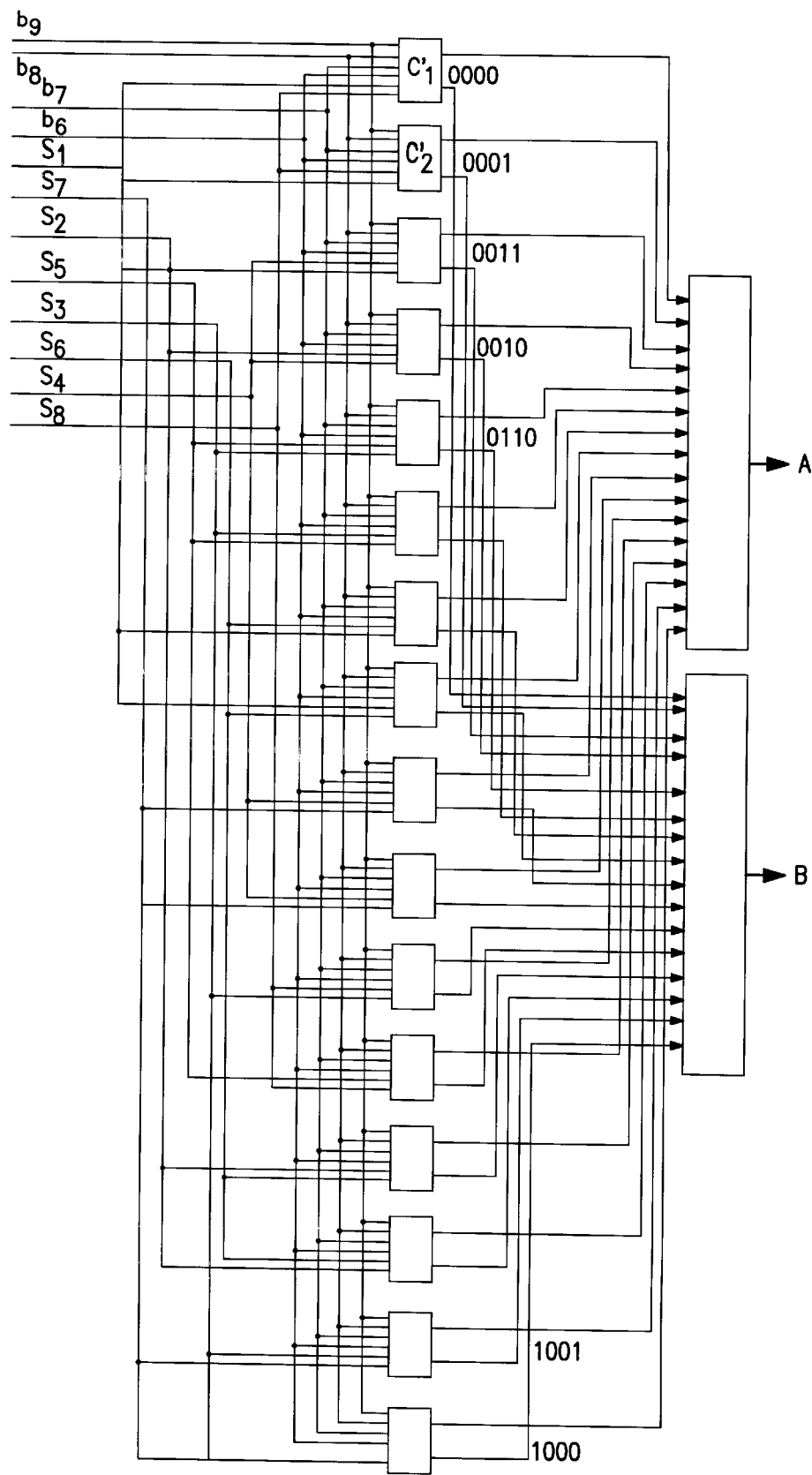

FIG. 8 is an electronic schematic diagram of a nonlimiting embodiment example of means 3 for analog multiplexing of the eight signals $S_1$ to $S_8$, by control signals $b_6$ to $b_9$. They essentially include $2^m$, or sixteen, combinations $C'_1$ to $C'_{16}$ of logic circuits, such as NOT or AND gates, or switches, delivering the signals A and B.

Figure 9:
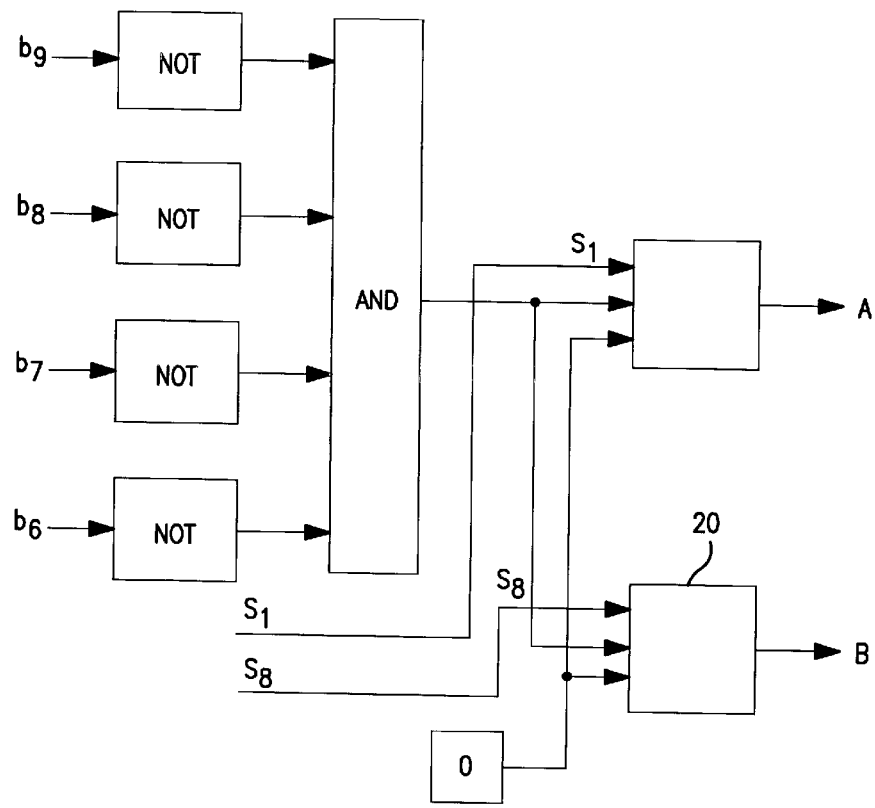

FIG. 9 is an example of the combination $C'_1$, whose input signals are $S_1$ and $S_8$, delivering the signals A and B obtained by the following Boolean equation:

if $\overline{b_6}$ and $\overline{b_7}$ and $\overline{b_8}$ and if $\overline{b_9}$=1, then $S_1$=A and $S_8$=B.

Finally, the sensor has means 4 for fine interpolation of the two signals A and B coming from the multiplexing means, functioning in an identical manner in each of the $2^m$ sectors $P_i$, in order to generate (n-m) digital output signals, $b_1$, $b_2$, ... $b_{n-m-1}$, $b_{n-m}$, which are the low order bits of the signal. These digital output signals are encoded in such a way as to cut each of the $2^m$ sectors $P_i$ obtained previously and with angle $2\pi/2^m$ radians each, into $2^{n-m}$ subsectors with angle $2\pi/2^n$ in order to obtain the desired final resolution.

Figure 10:
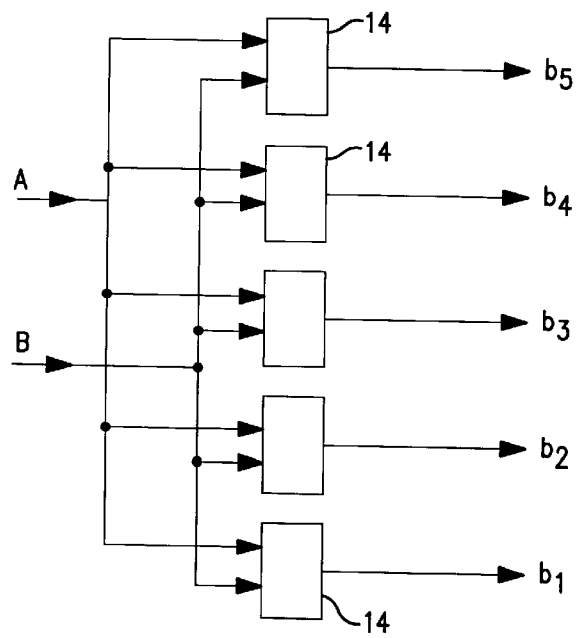
Figure 11:
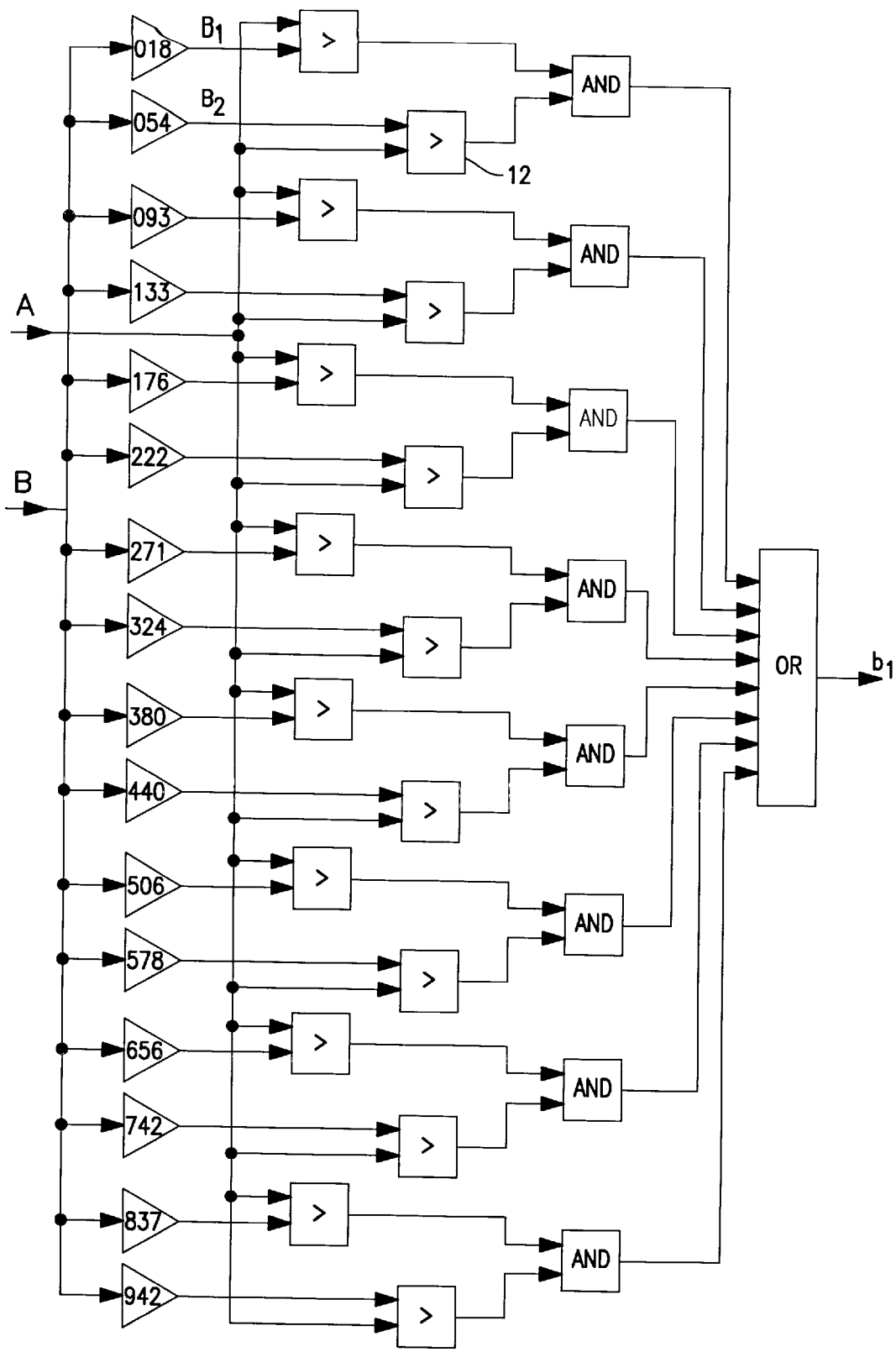

For this purpose, according to a characteristic of the invention, means 4 of fine interpolation carries out the attenuations of the signal B by attenuation factors $k_j$, with values equal to:

$K_j$=-$\sin(j*2\pi/2^n)/\sin(j*2\pi/2^n-2\pi/2^{m-1})$ where j: positive whole number varying from 1 to $(2^{n-m}-1)$ and delivering attenuation signals $B_j$. The attenuations of the signal B are carried out by combined resistors networks in order to obtain the determined attenuation factors. Then, each signal $B_j$ is compared with the signal A, in each sector $P_i$, and their intersection corresponds to a well-defined transition of one of the (n-m) digital output signals $b_1$, $b_2$, ... $b_{n-m-1}$, $b_{n-m}$, whose coding is identical on each of the $2^m$ sectors $P_i$. The obtaining of the intersection between the signal A and each signal $B_j$ is done by means of comparators 12 and of logic gates 13, executing logical combinations 14 between the digital signals coming from these comparisons, as shown by FIGS. 10 and 11, respectively, an electronic schematic diagram of an embodiment example of means 4 of fine interpolation delivering the five binary output signals $b_1$ to $b_5$, and a schematic diagram of a group of electronic circuits delivering the binary signal $b_1$ from the two signals A and B.

In the particular embodiment chosen, for which the desired final resolution is 512 points per revolution, the step of processing of the signal, which made it possible to divide the signal over a period of $2\pi$ radians into sixteen identical sectors $P_1$ to $P_{16}$ of 22.5E each, is followed by a step consisting of dividing each sector $P_i$ into 32 subsectors, with an angle equal to 360/512=0.703E each.

Figure 12A:
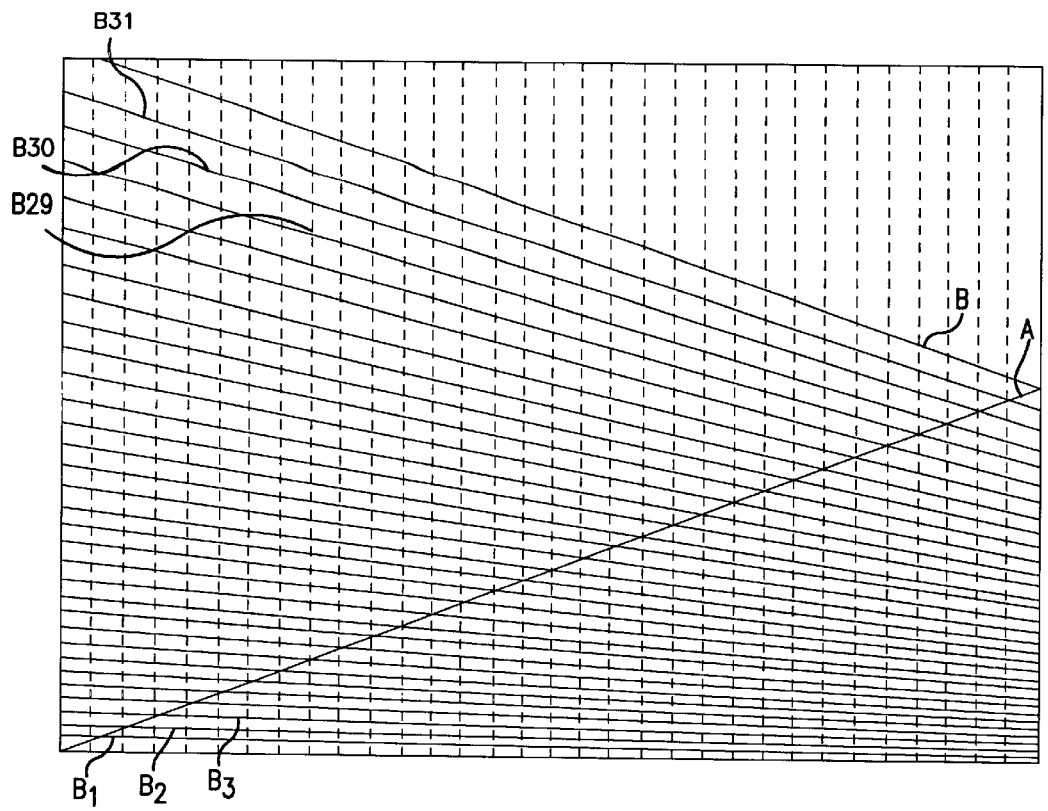
Figure 12B:
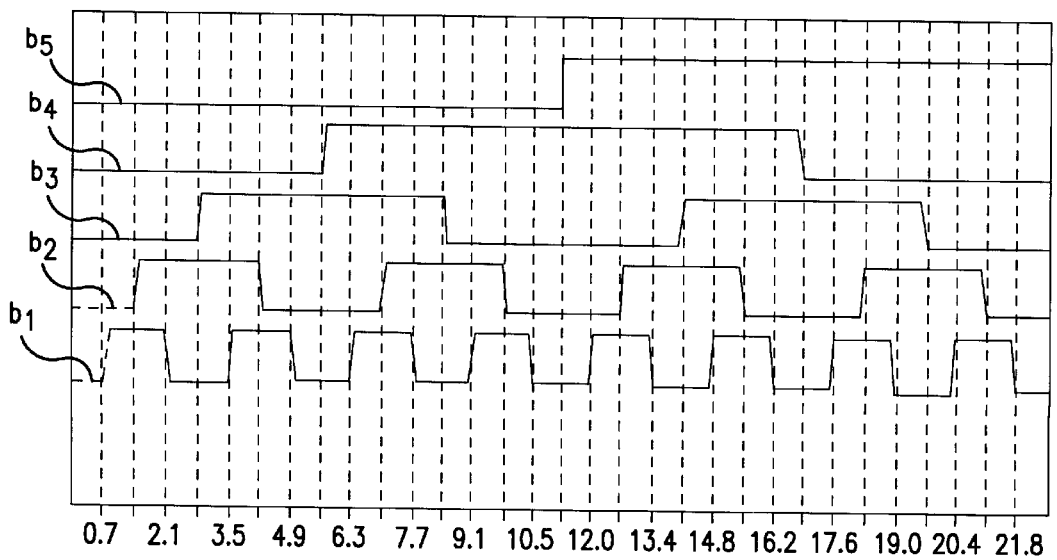

FIG. 12a is an enlarged graphical representation of sector $P_1$, between 0 and 22.5E, in which are represented the signals A and B, on the one hand, and the ($2^{n-m}$-1), or 31 signals $B_1$ to $B_{31}$, on the other hand. FIG. 12b is a graphical representation of the five digital signals $b_1$ to $b_5$. Thus, as seen in FIG. 3, the device for processing of the two sinusoidal signals $S_1$ and $S_2$ generates the m high order bits of the output signal of the position sensor, which are referenced $b_{n-+1}$ to $b_n$, as well as the n-m low order bits referenced $b_1$ to $b_{n-m}$, which determine the absolute position over $2\pi$ of the moving part of said sensor which is connected with the rotating component.

The main advantage of the device for processing of the signals delivered by two stationary sensors, opposite the moving target of the position sensor according to the invention, lies in the fact that each of the leading edges of the n output signals $b_1$ to $b_n$ is generated by ratiometric comparison between two signals, which makes it possible for the input signals $S_1$ and $S_2$ to be free of possible amplitude variations due, for example, to variations in temperature.

Moreover, the position of each of the fronts is defined unambiguously by means of the attenuation factors $k_j$, which are characteristics of the invention and which are determined so as to follow one another monotonically and regularly when the index j increases. This makes it possible to be sure of the position delivered by the sensor, because any leading edge representing the position x of the latter is always placed between the leading edge representing the position x-1 and the leading edge representing the position x+1, regardless of x. In no case can a leading edge representing the position x arrive after a leading edge representing the position x+1. No information loss, that is, no pulse loss is possible. This authorizes input signals $S_1$ and $S_2$ of the processing device to accept certain tolerances, for example, where the amplitudes or average values can possibly not be identical and where the quadrature may not be perfect, as can occur in the case of industrial manufacturing or assembly.

According to a first variant of the position sensor of the invention, the latter can give the semi-absolute position of the leg component to which it is attached, that is, the absolute position in a period without marking of the period in the revolution, from two sensitive elements delivering two sinusoidal output signals $S_1$ and $S_2$ with maximum amplitudes equal to $A_0$, centered on the same average value $C_0$, in quadrature and with a period equal to $2k\pi$ revolution of the target, where k is a positive whole number greater than or equal to 2, and the means constituting the processing device is identical to the means described for obtaining the absolute position.

According to a second variant of the sensor according to the invention, it can give the relative position of the rotating component from a transformation of the n parallel digital output signals $b_i$ of the sensor, giving the absolute position according to the characteristics described in the preceding, into three signals $b_1$, $b_{QUAD}$ and $b_{TT}$.

Figure 13:
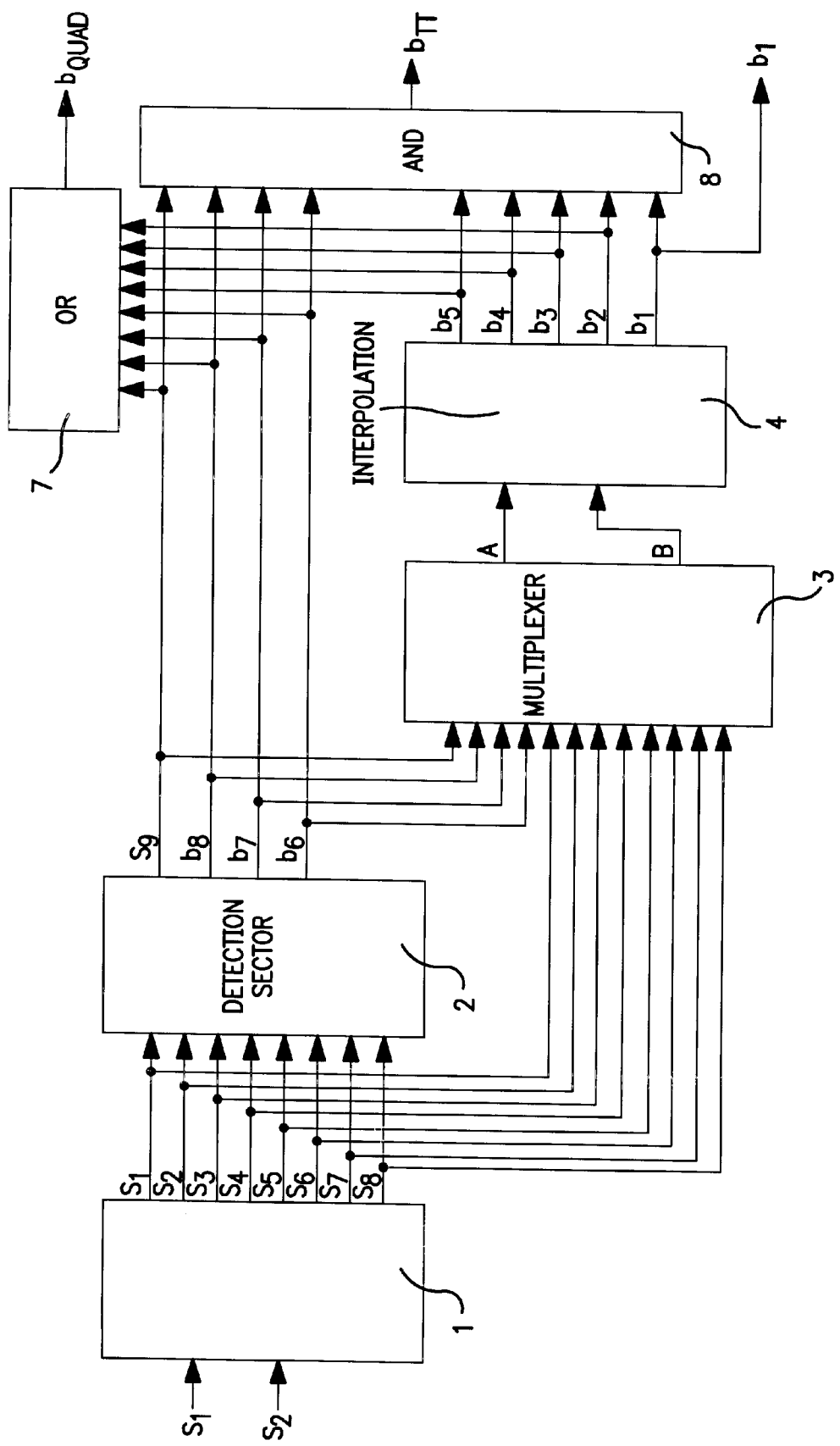
FIG. 13 is a functional electronic schematic diagram of a digital relative position sensor according to the invention.

As shown by FIG. 13, which is an electronic schematic diagram of a nonlimiting embodiment example, in the case of a resolution equal to $2^9$, the processing device moreover has means 7 for generation of a digital output signal $b_{QUAD}$, with the same resolution as the output signal $b_1$, and in quadrature with it, as well as means 8 for generation of a reference pulse $b_{TT}$. These means are each composed of logic circuits, where the first is an Exclusive-OR circuit for all of the output signals except the signal $b_1$ representing the lowest order bit, that is, for the n−1 signals $b_2$ to $b_n$, in order to generate the digital output signal $b_{QUAD}$ in perfect quadrature with said signal $b_1$ and with the same resolution, and where the second is a circuit with reference "revolution pulse" receiving as input the n signals $b_i$ and generating one unique reference pulse $b_{TT}$ per revolution, called the "revolution pulse" signal. The latter circuit is easily produced from a logical combination of the n logic signals $b_i$ marking a quite particular state of the group of the n output signals $b_i$, for example, when they are all in logic state 1 or in logic state 0. This logical combination of the digital signals $b_i$ is obtained tained by means of several AND and NOT logic gates, for example, performing the following Boolean operation:

$b_{TT} = b_1$ and $b_2$ and ... and $b_{n-1}$ and $b_n$.

The output signal $b_{QUAD}$ is obtained from a logical combination of the n−1 digital output signals from $b_2$ to $b_n$. This logical combination of the signals $b_i$ is obtained by means of several Exclusive-OR (XOR) logic gates performing the following Boolean operation:

$b_{QUAD} = b_2$ or $b_3$ or ... or $b_{n-1}$ or $b_n$.

Figure 14:
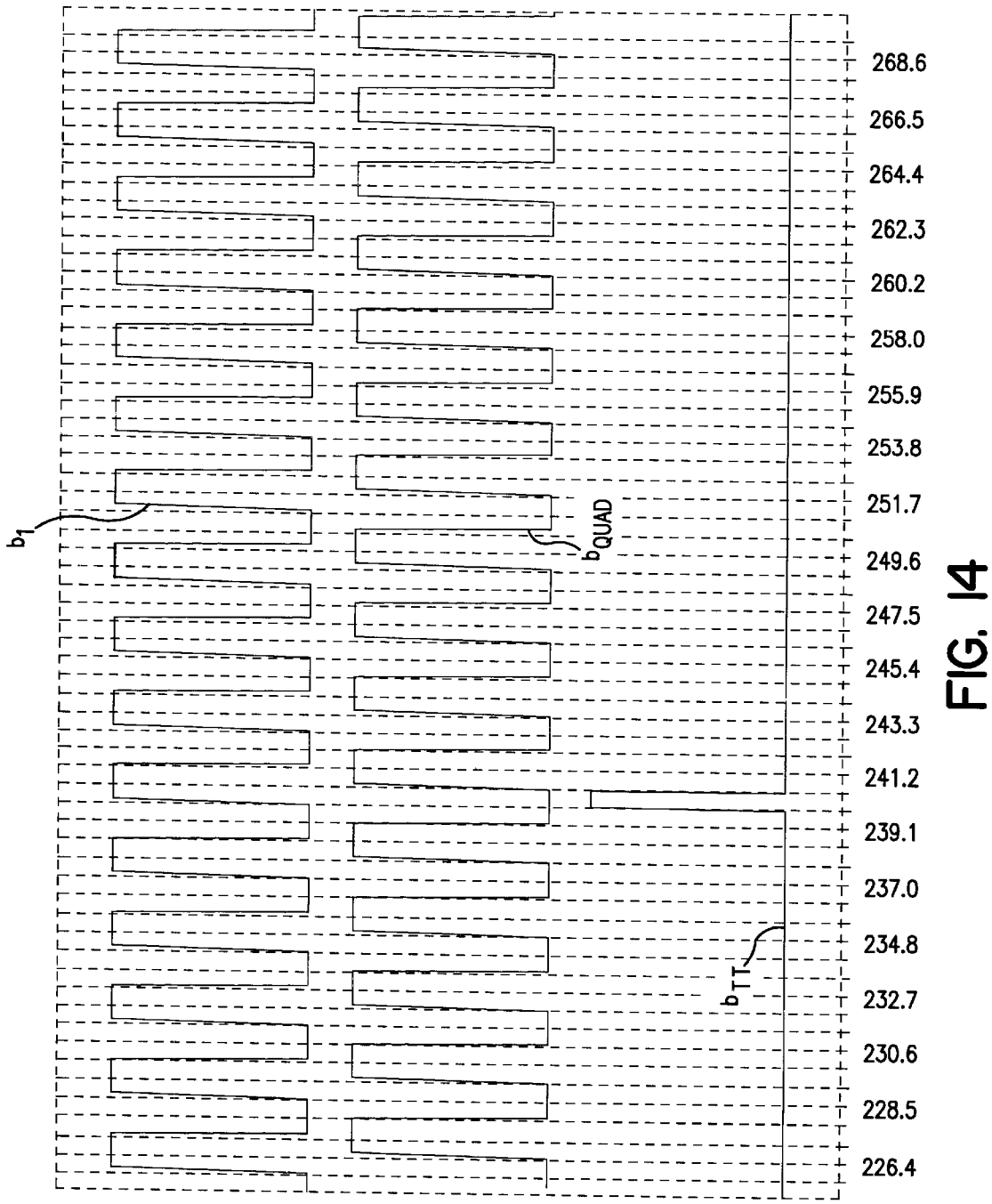
FIG. 14 is a graphic representation of the output signals of a relative position sensor according to the invention.

An example of output signals thus obtained is represented in FIG. 14.

The position sensor, whether the position is absolute or relative, which has just been described, can use any other system of encoding besides the Gray code. It can also be used with a multipolar magnetic encoder, with a number of north and south poles per revolution, in the case in which one wishes to produce a semi-absolute sensor, that is, absolute in a period without this period being recognizable. Moreover, the serialization of the n digital output signals $b_1$ to $b_n$ over a wire can also be envisaged by means of a data transmission protocol integrated in the processing device in order possibly to improve the device for processing of the signal.

Having described the invention, what is claimed is:

1. A digital position sensor for sensing position of a moving target, the digital position sensor comprising:
   a stationary analog sensor composed of two sensitive elements for delivering two sinusoidal output signals ($S_1$ and $S_2$), of equal maximum amplitudes ($A_0$), centered on the same average value ($C_0$), in quadrature and with a period equal to one revolution of the target; and
   a device for processing the two output signals ($S_1$ and $S_2$) generating n digital output signals in parallel, where n is a positive whole number greater than or equal to 2, for providing the position of a rotating component connected to the moving target, with a resolution equal to $2^n$, wherein the processing device includes:
   generation means (1) for generation, from the two input signals ($S_1$ and $S_2$), of $2^{m-1}$ signals ($S_i$), where (i) is a positive whole number varying from 1 to $2^{m-1}$, of the same amplitude ($A_0$), centered on the same average value ($C_0$) and successively phase shifted by $2\pi/2^{m-1}$ with respect to one another, where m is a positive whole number less than or equal to n;
   detection means (2) for detection of $2^m$ sectors ($P_i$) delimited by the $2^{m-1}$ signals ($S_i$), delivering m digital signals ($b_{n-m+1}$, $b_{n-m+2}$, ..., $b_{n-1}$, $b_n$) which correspond to the high order bits of the digital output signal of the sensor and which are encoded in such a way as to define the $2^m$ identical sectors ($P_i$);
   multiplexing means (3) for analog multiplexing the $2^{m-1}$ signals ($S_i$) delivered by the generating means (1), controlled by the m digital signals ($b_{n-m+1}$, $b_n$) coming from the detection means (2), and delivering two signals (A and B), one of which (A) is made up of the sequence of the portions of the $2^{m-1}$ signals ($S_i$) whose amplitude is between the centering value ($C_0$) and a first threshold ($L_1$), and the other of which (B) is made up of the sequence of the portions of the $2^{m-1}$ signals ($S_i$) whose amplitude is between the first threshold ($L_1$) and a second threshold ($L_2$) higher than ($L_1$); and
   interpolation means (4) for fine interpolation of the two signals (A and B) coming from the multiplexing means (3), in each of the $2^m$ sectors ($P_i$), in order to generate (n−m) digital signals ($b_1$, $b_2$, ... $b_{n-m-1}$, $b_{n-m}$) which correspond to the low order bits of the signal and which are encoded in such a way as to divide each of the $2^m$ sectors ($P_i$) with angle $2\pi/2^m$ into $2^{n-m}$ identical subsectors with angle $2\pi/2^n$ in order to obtain the desired resolution, all of the digital output signals ($b_1$, ..., $b_{n-m}$, $b_{n-m+1}$, ..., $b_n$) of the position sensor being representative of the absolute position of the rotating component.

2. A digital position sensor for sensing position of a moving target, the digital position sensor comprising:
   a stationary analog sensor composed of two sensitive elements for delivering two sinusoidal output signals ($S_1$ and $S_2$), of equal maximum amplitudes ($A_0$), centered on the same average value ($C_0$), in quadrature and with period equal to $2k\pi$ revolution of the target, where k is a positive whole number greater than or equal to 2; and
   a device for processing of the two output signals ($S_1$ and $S_2$) generating n digital output signals in parallel, where n is a positive whole number greater than or equal to 2, for providing the position of a rotating component connected with the moving target, with a resolution equal to $2^n$, wherein the processing device includes:
   generation means (1) for generation, from the two input signals ($S_1$ and $S_2$), of a number of signals ($S_i$) equal to $2^{m-1}$, where i is a positive whole number varying from 1 to $2^{m-1}$, of the same amplitude ($A_0$), centered on the same average value ($C_0$) and successively phase shifted by $2\pi/2^{m-1}$ with respect to one another, where m is a positive whole number less than or equal to n;
   detection means (2) for detection of $2^m$ sectors ($P_i$) delimited by the $2^{m-1}$ signals ($S_i$), delivering m digital signals ($b_{n-m+1}, b_{n-m+2}, \ldots, b_{n-1}, b_n$) which correspond to the high order bits of the digital output signal of the sensor and which are encoded in such a way as to define the $2^m$ identical sectors ($P_i$);

multiplexing means (3) for analog multiplexing of the $2^{m-1}$ signals ($S_i$) delivered by the generating means (1), controlled by the m digital signals ($b_{n-m+1}, b_n$) coming from the detection means (2), and delivering two signals (A and B), one of which (A) is made up of the sequence of the portions of the $2^{m-1}$ signals ($S_i$) whose amplitude is between the centering value ($C_0$) and a first threshold ($L_1$), and the other of which (B) is made up of the sequence of the portions of the $2^{m-1}$ signals ($S_i$) whose amplitude is between the first threshold ($L_1$) and a second threshold ($L_2$) higher than the first ($L_1$); and interpolation means (4) for fine interpolation of the two signals (A and B) coming from the multiplexing means (3), in each of the $2^m$ sectors ($P_i$), in order to generate (n–m) digital signals ($b_1, b_2, \ldots b_{n-m-1}, b_{n-m}$) which correspond to the low order bits of the digital output signal and which are encoded in such a way as to divide each of the $2^m$ sectors ($P_i$) with angle $2\pi/2^m$ into $2^{n-m}$ identical subsectors with angle $2\pi/2^n$ in order to obtain the desired resolution, all of the digital output signals ($b_1, \ldots, b_{n-m}, b_{n-m+1}, \ldots, b_n$) of the position sensor being representative of the absolute position of the rotating component.

3. A digital position sensor according to claim 1, wherein the multiplexing means (3) generates the signals (A and B) from thresholds ($L_1$) and ($L_2$) of determined values:

$$L_1 = A_0 \sin(2\pi/2^m)$$

$$L_2 = A_0 \sin(2\pi/2^{m-1}).$$

4. A digital position sensor according to claim 3, wherein the multiplexing means (3) includes $2^m$ combinations of logic circuits, such as NOT and AND gates.

5. A digital position sensor according to claim 1, wherein the interpolation means (4) generates signals ($B_j$), where j is a whole number varying from 1 to ($2^{n-m}-1$), which are attenuations of the signal (B) by attenuation factors ($k_j$), with values equal to:

$$k_j = -\sin(j*2\pi/2^n)/\sin(j*2\pi/2^n - 2\pi/2^{m-1})$$

compares each signal ($B_j$) with the signal (A), then executes logical combinations of the digital signals coming from these comparisons, in order to deliver the (n–n) digital output signals ($b_1, b_2, \ldots b_{n-m-1}, b_{n-m}$) corresponding to the low order bits of the signal.

6. A digital position sensor according to claim 1, for providing the position of a rotating component with a resolution equal to $2^9$, wherein the generation means (1) for generation of the signals ($S_i$) of the processing device generates $2^{m-1}=8$ signals ($S_1$ to $S_8$), phase shifted by 45E with respect to one another, having the values:

$$S_7 = -S_1$$

$$S_5 = -S_2$$

$$S_3 = \frac{S_1 + S_2}{\sqrt{2}}$$

$$^-S_6 = -S_3$$

$$S_4 = \frac{S_1 - S_2}{\sqrt{2}}$$

$$S_8 = -S_4$$

which are obtained from summing circuits (7), NOT circuits (8) and amplifiers (9).

7. A digital position sensor according to claim 6, wherein the detection means (2) for detection of the $2^m=16$ sectors ($P_i$) includes four combinations ($C_6$ to $C_9$) of comparators (10) and of logic gates (11) of the AND and OR type, delivering the following digital signals:

$b_9 = 1$ if $S_7 > 0$, $b_8 = 1$ if $S_5 > 0$, $B_7 = 1$ if ($S_3 > 0$ and $S_4 > 0$) or ($S_6 > 0$ and $S_8 > 0$), $b_6 = 1$ if ($S_1 > S_8$ and $S_2 > S_4$) or ($S_5 > S_3$ and $S_1 > S_6$)

or ($S_7 > S_4$ and $S_5 > S_8$) or ($S_2 > S_6$ and $S_7 > S_3$).

8. A digital position sensor according to claim 1, wherein the processing device further comprises:

generation means (7) for generating a digital output signal (bQUAD) I in quadrature with the digital output signal ($b_1$) corresponding to the lowest order bit of the output signal of the digital position sensor and with the same resolution;

generation means (8) for generating a reference pulse ($b_{TT}$), where said digital signals ($b_1$), ($b_{QUAD}$) and ($b_{TT}$) give the relative position of the rotating component.

9. A digital position sensor according to claim 8, wherein the generation means (7) for generating a digital output signal ($b_{QUAD}$) performs the following Boolean operation by means of the Exclusive-OR (XOR) logical operator:

$b_{QUAD} = b_2$ or $b_3$ or $\ldots$ or $b_{n-1}$ or $b_n$.

10. A digital position sensor according to claim 8, wherein the generation means (8) for generating a reference pulse ($b_{TT}$) performs the following Boolean operation:

$b_{TT} = b_1$ and $b_2$ and $\ldots$ and $b_{n-1}$ and $b_n$.

11. A digital position sensor according to claim 9, wherein the generation means (7) for generating a digital output signal ($b_{QUAD}$) consists of an Exclusive-OR logic circuit receiving as input the digital output signals ($b_2$ to $b_n$), with the exception of the signal ($b_1$) corresponding to the lowest order bit of the output signal of the digital position sensor, and by the fact that the means (8) for generating a reference pulse ($b_{TT}$) consists of several AND and NOT logic gates.

12. A digital position sensor according to claim 10, wherein the generation means (7) for generating a digital output signal ($b_{QUAD}$) consists of an Exclusive-OR logic circuit receiving as input the digital output signals ($b_2$ to $b_n$), with the exception of the signal ($b_1$) corresponding to the lowest order bit of the output signal of the digital position sensor, and by the fact that the means (8) for generating a reference pulse ($b_{TT}$) consists of several AND and NOT logic gates.

13. A digital position sensor according to claim 5, wherein the interpolation means (4) includes resistive networks attenuating the signal (B).

14. A digital position sensor according to claim 1, wherein the n digital output signals ($b_i$) are serialized by means of a data transmission protocol integrated in the processing device.

15. A digital position sensor according to claim 1, wherein the coding of the n digital output signals ($b_1$ to $b_n$) makes it possible to define unambiguously the absolute position of the sensor.

16. A digital position sensor according to claim 2, wherein the multiplexing means (3) generates the signals (A and B) from thresholds ($L_1$) and ($L_2$) of determined values:

$$L_1 = A_0 \sin(2\pi/2^m)$$

$$L_2 = A_0 \sin(2\pi/2^{m-1}).$$

17. A digital position sensor according to claim 16, wherein the multiplexing means (3) includes $2^m$ combinations of logic circuits, such as NOT and AND gates.

18. A digital position sensor according to claim 2, wherein the interpolation means (4) generates signals ($B_j$), where j is a whole number varying from 1 to ($2^{n-m}-1$), which are attenuations of the signal (B) by attenuation factors ($k_j$), with values equal to:

$$K_j = -\sin(j*2\pi/2^n)/\sin(j*2\pi/2^n - 2\pi/2^{m-1})$$

compares each signal ($B_j$) with the signal (A), then executes logical combinations of the digital signals coming from these comparisons, in order to deliver the (n–n) digital output signals ($b_1, b_2, \ldots b_{n-m-1}, b_{n-m}$) corresponding to the low order bits of the signal.

19. A digital position sensor according to claim 2, for providing the position of a rotating component with a resolution equal to $2^9$, wherein the generation means (1) for generation of the signals ($S_i$) of the processing device generates $2^{m-1}=8$ signals ($S_1$ to $S_8$), phase shifted by 45E with respect to one another, having the values:

$$S_7 = -S_1$$

$$S_5 = -S_2$$

$$S_3 = \frac{S_1 + S_2}{\sqrt{2}}$$

-continued $$S_6 = -S_3$$

$$S_4 = \frac{S_1 - S_2}{\sqrt{2}}$$

$$S_8 = -S_4$$

which are obtained from summing circuits (7), NOT circuits (8) amplifiers (9).

20. A digital position sensor according to claim 19, wherein the detection means (2) for detection of the $2^m=16$ sectors ($P_i$) includes four combinations ($C_6$ to $C_9$) of comparators (10) and of logic gates (11) of the AND and OR type, delivering the following digital signals:

$b_9=1$ if $S_7>0$, $b_8=1$ if $S_5>0$, $B_7=1$ if ($S_3>0$ and $S_4>0$) or ($S_6>0$ and $S_8>0$), $b_6=1$ if ($S_1>S_8$ and $S_2>S_4$) or ($S_5>S_3$ and $S_1>S_6$)

or ($S_7>S_4$ and $S_5>S_8$) or ($S_2>S_6$ and $S_7>S_3$).

21. A digital position sensor according to claim 18, wherein the interpolation means (4) includes resistive networks attenuating the signal (B).

22. A digital position sensor according to claim 2, wherein the n digital output signals ($b_i$) are serialized by means of a data transmission protocol integrated in the processing device.

23. A digital position sensor according to claim 2, wherein the coding of the n digital output signals ($b_1$ to $b_n$) makes it possible to define unambiguously the absolute position of the sensor.

* * * * *